US008619427B2

(12) United States Patent
Burton et al.

(10) Patent No.: US 8,619,427 B2
(45) Date of Patent: Dec. 31, 2013

(54) MEDIA CONTENT DEVICE CHASSIS WITH INTERNAL EXTENSION MEMBERS

(75) Inventors: David Robert Burton, Skipton (GB); Trevor Hardaker, Bradford (GB); Matthew Stephens, Harrogate (GB); Greg Blythe, Wilberfoss (GB); Chris Lockwood, Halifax (GB)

(73) Assignee: Eldon Technology Limited, Keighley (GB)

( * ) Notice: Subject to any disclaimer, the term of this patent is extended or adjusted under 35 U.S.C. 154(b) by 368 days.

(21) Appl. No.: 13/052,685

(22) Filed: Mar. 21, 2011

(65) Prior Publication Data

US 2012/0243166 A1  Sep. 27, 2012

(51) Int. Cl.
*H05K 7/20* (2006.01)

(52) U.S. Cl.
USPC ........... 361/714; 361/704; 361/705; 361/711; 165/185

(58) Field of Classification Search
USPC .................................. 301/704, 707, 711, 714
See application file for complete search history.

(56) References Cited

U.S. PATENT DOCUMENTS

| 5,008,582 | A | | 4/1991 | Tanuma et al. |
| 5,296,739 | A | * | 3/1994 | Heilbronner et al. ......... 257/687 |
| 5,500,556 | A | | 3/1996 | Kosugi |
| 5,673,176 | A | | 9/1997 | Penniman et al. |
| 5,777,847 | A | * | 7/1998 | Tokuno et al. ................ 361/705 |
| 5,911,582 | A | | 6/1999 | Redford et al. |
| 5,921,757 | A | | 7/1999 | Tsutsui et al. |
| 5,965,937 | A | | 10/1999 | Chiu et al. |
| 6,005,771 | A | * | 12/1999 | Bjorndahl et al. ............ 361/699 |
| 6,025,991 | A | | 2/2000 | Saito |
| 6,049,469 | A | | 4/2000 | Hood et al. |
| 6,128,194 | A | | 10/2000 | Francis |

(Continued)

FOREIGN PATENT DOCUMENTS

| EP | 0634890 A1 | 1/1995 |
| EP | 1760781 A1 | 8/2006 |

(Continued)

OTHER PUBLICATIONS

Fukuda Kenichi, Matsushita Electric Works Ltd, "Electric Component Mounting Structure," Machine Translation of Detailed Description: JP Publication No. 2003249780, Published Sep. 9, 2003; Accessed and downloaded on Feb. 26, 2013 from http://www.ipdl.inpit.go.jp/homepg_e.ipdl.

(Continued)

*Primary Examiner* — Anthony Q Edwards
(74) *Attorney, Agent, or Firm* — Lowe Graham Jones PLLC

(57) ABSTRACT

A media content receiving device, such as a set top box, includes a chassis that incorporates a heat bridge, a heat shield or both. The heat bridge may take the form of a structural wall coupled to, but preferably integrated with, the chassis to facilitate conductive heat transfer into a chassis panel. The heat bridge may be configured to receive heat radiated from a chip having a die to be cooled. The heat shield may take the form of a wall-type structure protruding from a chassis panel. For example, the heat shield may extend from a top panel of the chassis in a fin-like or flange-like manner to provide a thermal barrier between adjacent electrical components arranged on a circuit board. While the heat shield protects the adjacent component from potential thermal damage or degradation, it may also operate to transfer heat into the chassis.

24 Claims, 4 Drawing Sheets

(56) References Cited

U.S. PATENT DOCUMENTS

| | | | |
|---|---|---|---|
| 6,157,538 A * | 12/2000 | Ali et al. | 361/704 |
| 6,167,949 B1 * | 1/2001 | Langley et al. | 165/104.33 |
| 6,195,257 B1 * | 2/2001 | Janicek et al. | 361/704 |
| 6,212,073 B1 * | 4/2001 | Yamaguchi | 361/705 |
| 6,212,074 B1 | 4/2001 | Gonsalves et al. | |
| 6,219,236 B1 | 4/2001 | Hirano et al. | |
| 6,552,903 B2 * | 4/2003 | Sprattle et al. | 361/704 |
| 6,577,504 B1 | 6/2003 | Lofland et al. | |
| 6,588,497 B1 | 7/2003 | Glezer et al. | |
| 6,631,077 B2 * | 10/2003 | Zuo | 361/699 |
| 6,665,187 B1 * | 12/2003 | Alcoe et al. | 361/719 |
| 6,818,276 B2 | 11/2004 | Bourdelais et al. | |
| 6,946,856 B1 | 9/2005 | Tellkamp | |
| 6,982,877 B2 | 1/2006 | Vinson et al. | |
| 7,236,368 B2 | 6/2007 | Maxwell et al. | |
| 7,248,475 B2 | 7/2007 | Paydar et al. | |
| 7,310,233 B2 | 12/2007 | Bell | |
| 7,312,534 B2 | 12/2007 | delos Santos et al. | |
| 7,345,885 B2 | 3/2008 | Boudreaux et al. | |
| 7,417,862 B2 * | 8/2008 | Lo | 361/719 |
| 7,550,825 B2 | 6/2009 | Santos et al. | |
| 7,561,428 B2 * | 7/2009 | Watanabe | 361/714 |
| 7,629,400 B2 | 12/2009 | Hyman | |
| 7,742,299 B2 | 6/2010 | Sauciuc et al. | |
| 7,944,046 B2 * | 5/2011 | Chao | 257/713 |
| 7,983,045 B2 | 7/2011 | Bhattacharya et al. | |
| 8,179,679 B2 | 5/2012 | Slagle | |
| 8,363,411 B2 | 1/2013 | Stephens et al. | |
| 8,373,986 B2 | 2/2013 | Sun | |
| 2004/0032710 A1 | 2/2004 | Fujiwara et al. | |
| 2005/0008832 A1 | 1/2005 | Santos | |
| 2005/0013116 A1 | 1/2005 | Pokharna et al. | |
| 2005/0036292 A1 | 2/2005 | Chengalva et al. | |
| 2005/0111195 A1 | 5/2005 | Wu et al. | |
| 2005/0236171 A1 * | 10/2005 | Garcia | 174/35 GC |
| 2005/0266295 A1 | 12/2005 | Takai | |
| 2006/0198108 A1 | 9/2006 | Refai-Ahmed et al. | |
| 2007/0119573 A1 | 5/2007 | Mahalingam et al. | |
| 2007/0215907 A1 | 9/2007 | Krimmer et al. | |
| 2007/0278683 A1 | 12/2007 | Santos et al. | |
| 2008/0135216 A1 | 6/2008 | Zhang et al. | |
| 2008/0137291 A1 | 6/2008 | Mongia et al. | |
| 2008/0277780 A1 | 11/2008 | Hayakawa | |
| 2009/0091904 A1 | 4/2009 | Hatanaka et al. | |
| 2010/0111666 A1 | 5/2010 | Guitton et al. | |
| 2010/0261386 A1 | 10/2010 | Blum et al. | |
| 2010/0290183 A1 | 11/2010 | Rijken et al. | |
| 2010/0309631 A1 * | 12/2010 | Hill et al. | 361/705 |
| 2011/0063801 A1 | 3/2011 | Lin et al. | |
| 2012/0050988 A1 | 3/2012 | Rothkopf et al. | |
| 2012/0250256 A1 | 10/2012 | Burton et al. | |
| 2012/0250260 A1 | 10/2012 | Burton | |

FOREIGN PATENT DOCUMENTS

| | | |
|---|---|---|
| EP | 1991042 A2 | 5/2009 |
| EP | 2138922 A1 | 12/2009 |
| JP | 2003249780 A | 9/2003 |
| WO | 03/107427 A1 | 12/2003 |
| WO | 2006101346 A1 | 9/2006 |
| WO | 2009/058149 | 5/2009 |
| WO | 2009096966 A1 | 8/2009 |
| WO | 2011146302 A1 | 11/2011 |

OTHER PUBLICATIONS

Stephens et al., Matthew, "Passive, Low-Profile Heat Transferring System," U.S. Appl. No. 13/051,930, filed Mar. 18, 2011.

Burton et al., David Robert, "Media Device Having a Piezoelectric Fan," U.S. Appl. No. 13/074,964, filed Mar. 29, 2011.

Burton et al., David Robert, "Media Content Device with Customized Panel," U.S. Appl. No. 13/074,971, filed Mar. 29, 2011.

Hardaker et al., Trevor, "Apparatus, Systems and Methods for Detecting Infrared Signals at a Media Device Configured to be Positioned in Different Orientations," U.S. Appl. No. 13/036,943, filed Feb. 28, 2011.

Burton et al., David Robert, "Apparatus, Systems and Methods for Power Line Carrier Data Communication to Dc Powered Electronic Device," U.S. Appl. No. 13/074,736, filed Mar. 29, 2011.

Burton et al., David Robert, "Apparatus, Systems and Methods for Securely Storing Media Content Events on a Flash Memory Device," U.S. Appl. No. 13/053,492, filed Mar. 22, 2011.

Burton et al., David Robert, "Apparatus, Systems and Methods for Control of Inappropriate Media Content Events," U.S. Appl. No. 13/053,487, filed Mar. 22, 2011.

PiezoFans, LLC—Piezo Fans and Piezoelectric Technology, "Advanced Micro-Cooling Systems" Product Description, http://piezofans.com/, download date Mar. 4, 2011, 2 pages.

* cited by examiner

MEDIA CONTENT DEVICE CHASSIS WITH INTERNAL EXTENSION MEMBERS

BACKGROUND

Media content receiving devices, which may take the form of set top boxes (STBs), are configured to deliver one or more selected programs to a media presentation device coupled to or within the media device. Typically, the media device connects to a television and an external signal source in which the signal (e.g., cable signal) is converted into media content displayable on the television. However, the media device may operate with other types of media presentation devices, the latter taking the form of, but not limited to, televisions (TVs), personal computers (PCs), stereos, personal digital assistants (PDAs), surround-sound systems, and digital video recorders (DVRs). Particular programs may be selected by a user who provides program selection instructions to the media device. The selected program may then be presented to the user. For example, if the selected program is a movie, the video portion of the movie is displayed on a display of the TV, the PC, or the like. The audio portion of the movie may concurrently be presented over the speakers of the TV, the stereo, or the surround-sound system. In some instances, the selected program may be stored into a DVR or other recording device for later retrieval and presentation. The DVR may be an integrated component of the media device, or the DVR may be a stand-alone device that is communicatively coupled to the media device.

For a variety of reasons such as consumer demand, portability, spatial constraints and aesthetics, the tendency in the marketplace has been toward more streamlined components still capable of providing a high quality media content (e.g., flat screen televisions and small, wall mounted speakers).

However, one of the continual challenges of making a low profile, streamlined media device is the effective transfer of heat away from a die provided on a chip of a printed circuit board (PCB) or alternatively the effective insulation of a component adjacent to or in a vicinity of the die. Conventional set boxes typically have an active cooling system employing one or more fans or blowers to move air through media device. One drawback of a conventional fan system is the amount of spatial envelope needed within the media device to mount and adequately operate the fan. Thermal insulation, on the other hand, is usually accomplished using various pastes, epoxies, potting compounds, coatings or laminates.

SUMMARY

In accordance with one aspect, an exemplary system comprises a thermally conductive chassis having at least one panel with internal and external surfaces, and wherein the external surface is exposed to an environment having an environment temperature that is lower than an internal chassis temperature; at least one integrated circuit chip having a die situated thereon; and a heat bridge integrally formed with the chassis and protruding from the internal surface, the heat bridge arranged proximate the die to receive thermal energy from the die, the heat bridge in thermal, conductive cooperation with the chassis to transfer the received thermal energy to the external surface of the chassis for dissipation into the environment.

In accordance with another aspect, a system comprises a thermally conductive chassis having at least one panel with internal and external surfaces, and wherein the external surface is exposed to an environment having an environment temperature that is lower than an internal chassis temperature; a circuit board located within the chassis; at least one integrated circuit chip having a die, the chip positioned on the circuit board, the die operable to radiate an amount of thermal energy; an electronic component positioned on the circuit board within a vicinity of the chip; and a heat shield coupled to the chassis and configured to protrude from the internal surface by an amount that sufficiently shields the electronic component from radiated thermal energy generated by the die.

In accordance with yet another aspect, a system comprises a thermally conductive chassis having at least one panel with internal and external surfaces, and wherein the external surface is exposed to an environment having an environment temperature that is lower than an internal chassis temperature; a circuit board located within the chassis; a first electronic component positioned on the circuit board, the first electronic component operable to radiate an amount of thermal energy; a second electronic component positioned on the circuit board within a vicinity of the first electronic component; and a heat shield coupled to the chassis, the heat shield protruding from a panel of the chassis by an amount that substantially shields heat energy given off by the first electronic component from the second electronic component.

BRIEF DESCRIPTION OF THE DRAWINGS

In the drawings, identical reference numbers identify similar elements or acts. The sizes and relative positions of elements in the drawings may not be necessarily drawn to scale. For example, the shapes of various elements, thicknesses and angles may not be drawn to scale, and some of these elements may be arbitrarily enlarged or positioned to improve drawing legibility. Preferred and alternative embodiments are described in detail below with reference to the following drawings.

DETAILED DESCRIPTION

A media device, which may take the form of a set top box (STB), includes a housing or chassis that incorporates a heat bridge, a heat shield or both. The heat bridge may take the form of at least one structural wall coupled to, but preferably integrated with, the chassis to facilitate conductive heat transfer into one or more panels of the chassis. The heat bridge may be configured to receive heat energy radiated from an integrated circuit chip having a die. Additionally or alternatively, the heat bridge, heat shield, or both may be a may be a preferred way of providing cooling where fan noise may be a factor (e.g., no fan means no fan noise), such as when the media device is located in a bedroom or some other quiet environment.

The heat shield may take the form of a wall-type structure protruding from one or more of the chassis panels. For example, the heat shield may extend from a top panel of the chassis in a fin-like or flange-like manner and provides a thermal barrier between an integrated circuit chip with a die and an adjacent component arranged on a circuit board. While the heat shield protects the adjacent component from potential thermal damage or degradation, it may also operate to transfer heat into the chassis or some other component.

Figure 1:
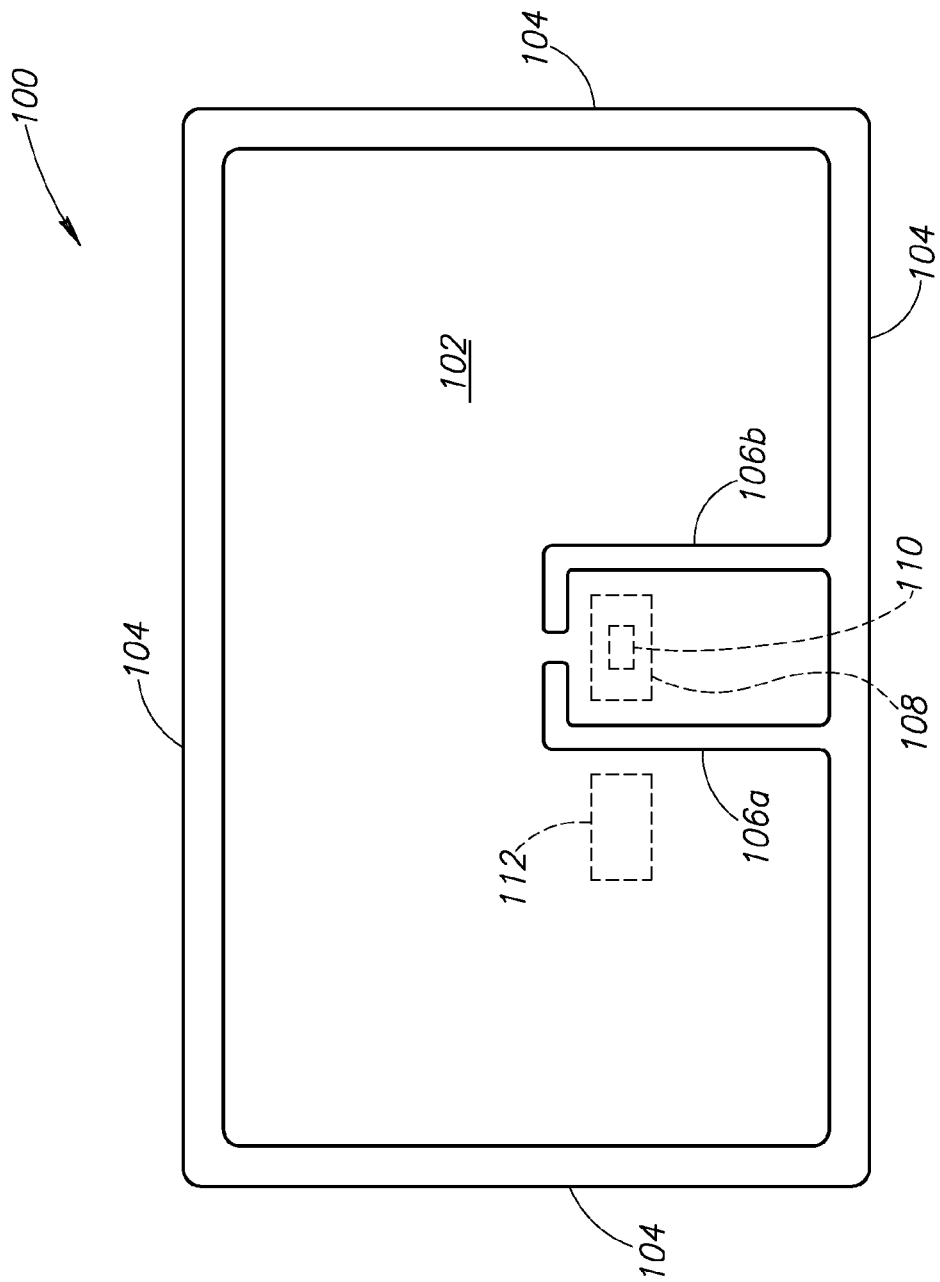
FIG. 1 is a bottom, interior plan view of a chassis for a media device in accordance with one embodiment.

FIG. 1 shows a chassis 100 for a media device with a view looking at a top panel 102 from the interior of the chassis. The top panel 102 may be coupled to or integrally formed with side walls 104. One or more heat bridges 106a, 106b extend or protrude from the interior surface of the top panel 102. Preferably, but not necessarily, the heat bridges 106a, 106b extend in a direction normal to the interior surface of the top panel 102. For purposes of illustrating conceptual, spatial relationships, a chip 108 having a die 110 and another component 112 (e.g., another integrated circuit chip, a memory, a capacitor, etc.) are shown in hidden line format because these components would typically be arranged on a circuit board (not shown) supported on a bottom panel (not shown) of the chassis 100.

Preferably, the heat bridges 106 are integrally formed with the panel 100. For example, the panel 100 and heat bridges 106 may be machined from a single piece of material; molded from a pre-formed mold or tool; or die cast as a unitary component. Alternatively, the heat bridges 106 may be attached to the panel 100 during fabrication of the panel 100 or during assembly of the media device. In the illustrated embodiment, the heat bridges 106 have an L-shaped configuration, but could take on a variety of other shapes or configurations. The heat bridges 106 may also engage or contact the side walls 104 in addition to the top panel 102, or alternatively may contact only one the top panel 102 or only the side walls 104. Nevertheless, the heat bridges 106 are configured to absorb enough heat from the die 110 such that heat does not damage or undesirably degrade the die 110, the chip 108 and the component 112.

The heat bridges 106 take the form of interior walls within the chassis that operate to facilitate heat transfer from the die 110 to the top panel 102, the side walls 104, or both. The heat bridges 106 may also operate as physical barriers to prevent convective or radiant heat transfer from the die 110 to the adjacent component 112.

Figure 2:
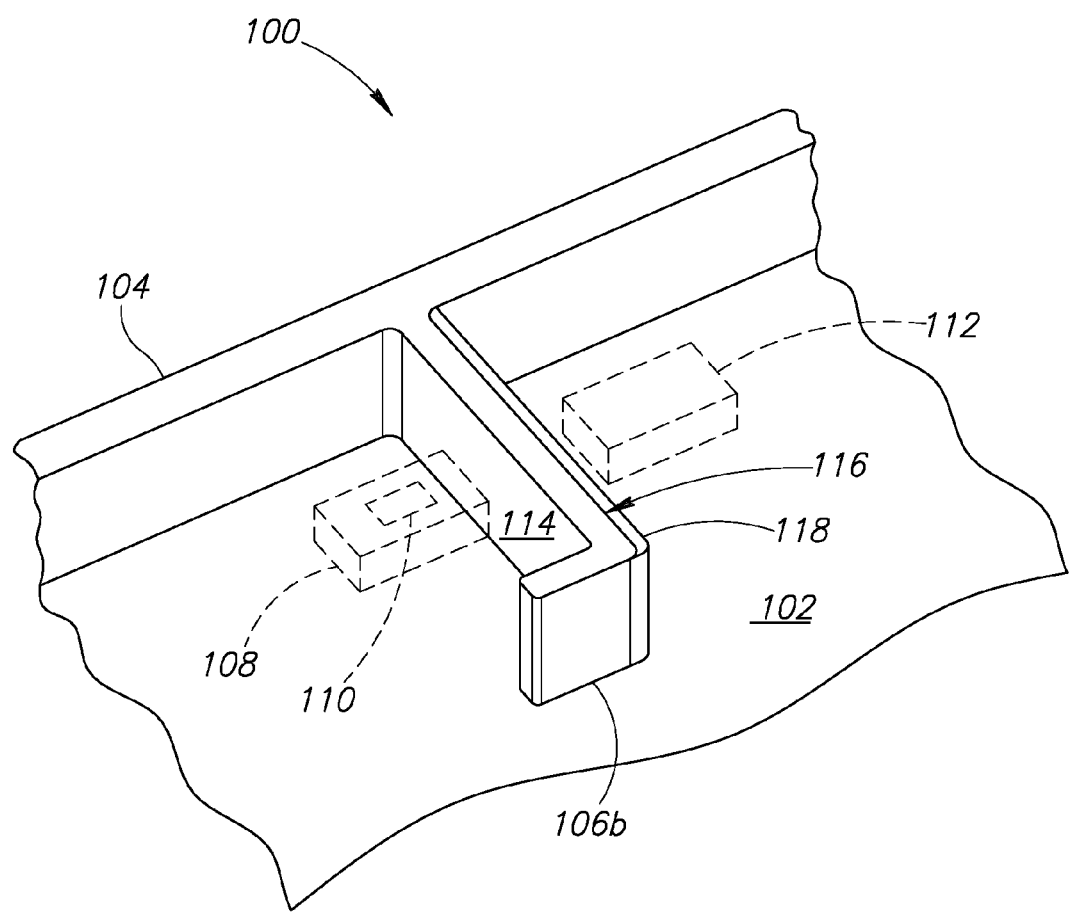
FIG. 2 is a perspective view of a portion of the top panel and one heat bridge extending therefrom in accordance with one embodiment.

FIG. 2 shows a portion of the chassis 100 with the heat bridge 106a removed for purposes of clarity. The heat bridge 106b includes a first surface 114 facing toward the die chip 108. The first surface 114 may be configured to efficiently absorb radiant heat from the die 110. In one embodiment, the first surface 114 is merely the surface of the heat bridge 106 and made from the same material. Preferably, the first surface 114 and the heat bridge 106 each have a high thermal diffusivity, which is a ratio that indicates how fast heat is propagated or diffused through a material during change of temperature with time. For example and in contrast to a fluid like air, metallic substances and silicon have large values of thermal diffusivity because it takes less time for the applied heat to penetrate and move through the medium. In another embodiment, the first surface 114 may include a coating material for absorbing radiant heat.

A second surface 116 of the heat bridge 106 facing toward the component 112 may have a thermal insulating layer 118 bonded or otherwise attached thereto. The insulating layer 118 includes a larger R-value than the material used to make the heat bridge 106. For example, the insulating layer 118 may be a layer of fiberglass. Thus, in operation, the first surface 114 operates to readily absorb heat generated by the die 110 while the second surface 116 and/or the layer 118 may operate to prevent heat that was absorbed by the heat bridge 106 from radiating toward the component 112.

Figure 3:
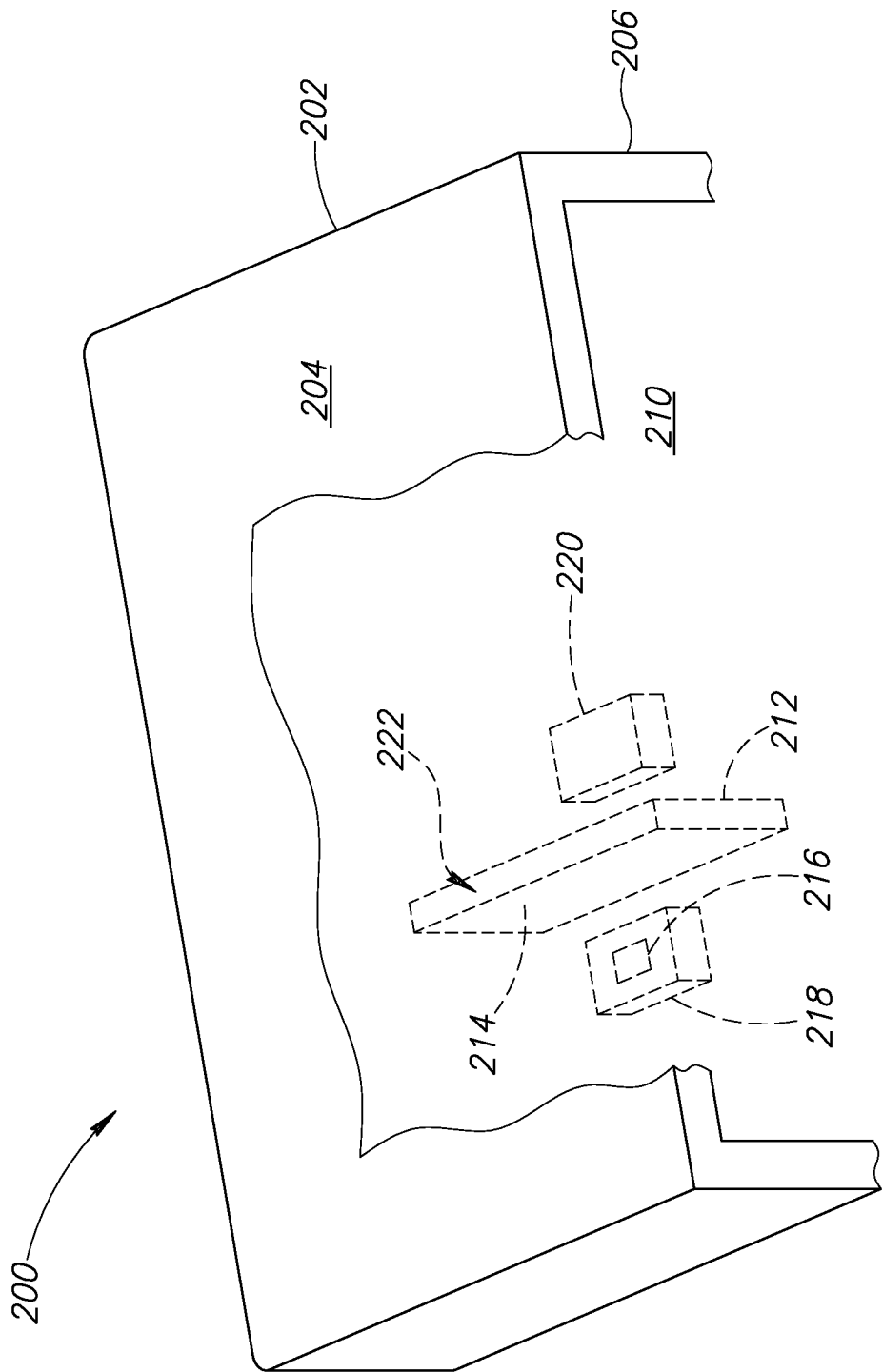
FIG. 3 is a perspective view of a media device with a top panel shown partially cut-away and a heat shield extending from the top panel in accordance with another embodiment.

FIG. 3 shows a media device 200 having a chassis 202, which includes a top panel 204, side panels 206 and a bottom panel 208 (not shown). The top panel 204 is shown as partially cut away to see inside a cavity 210 of the chassis 202. Extending downward from the top panel 204 is an exemplary heat shield 212 having a first surface 214 configured to reflect heat energy radiated from a die 216 supported on an integrated circuit chip 218. For example, the first surface 214 may be a polished surface to reflect the heat energy. The heat shield 212 is positioned between the chip 218 and another electronic component 220. By way of example, the heat shield 212 may be positioned between a microprocessor and a memory to reflect heat radiating from the processor. A top surface 222 of the heat shield 212 may be bonded to the top panel 204 or may be integrally formed therewith, for example molded or die cast therewith.

Figure 4:
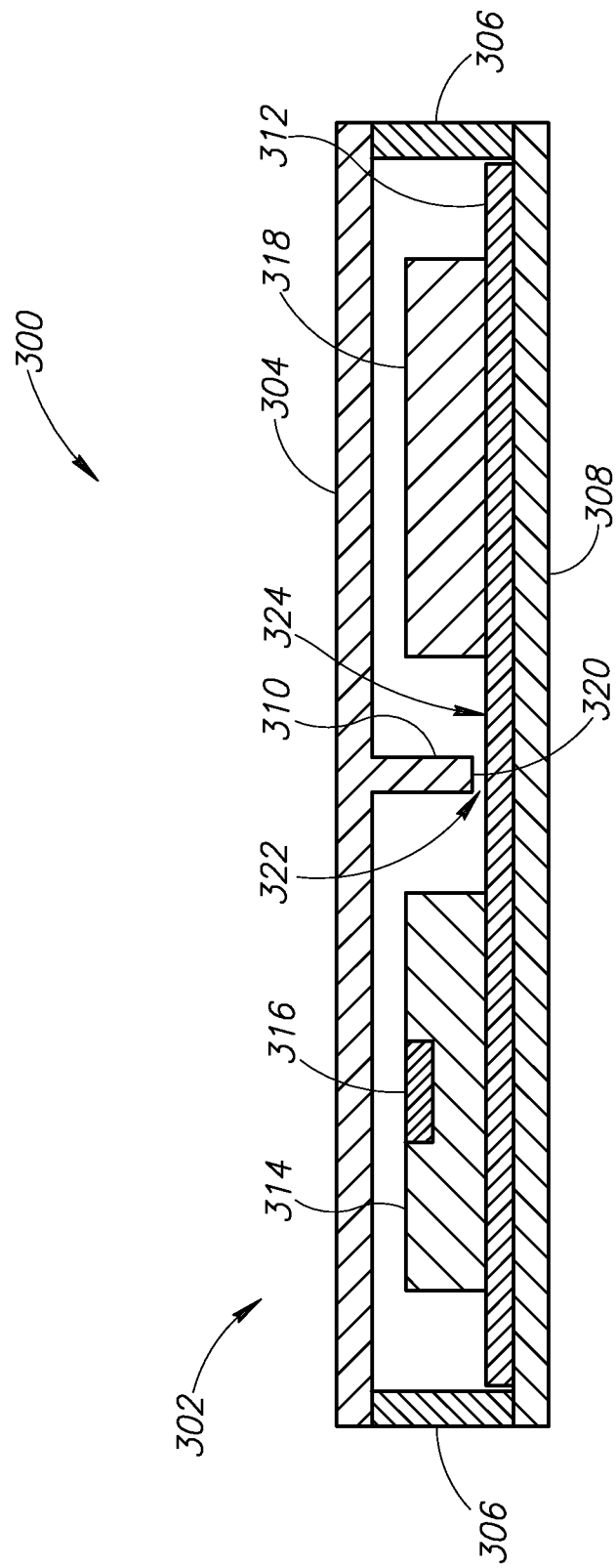
FIG. 4 is a cross-sectional view of a media device with a heat shield extending from a top panel, the heat shield spaced apart from a circuit board in accordance with yet another embodiment.

FIG. 4 shows a cross-sectional view of a media device 300 having a chassis 302 that includes a top panel 304, side panels 306 and a bottom panel 308. A heat shield 310 extends from the top panel 304 in a downward manner toward the bottom panel 308, which supports a circuit board 312. A first chip 314 having a die 316 is arranged on one region of the circuit board 312 and another computing component 318 is arranged on another region of the circuit board 312. The heat shield 310 extends such that a free end 320 comes close to, but does not necessarily contact the circuit board 312. Thus in an exemplary embodiment, an air gap 322 remains between the free end 320 and the circuit board 312. Contact between the heat shield 310 and the circuit board 312 may cause undesired abrasion or even electrical shorting of the circuit board 312 over time due to a variety of conditions, such as flexing of the circuit board 312. In an alternate embodiment, the free end 320 may extend downward and contact an interfacing material 324, which may take the form of a silk screen printed onto the surface of the circuit board 312. In this latter embodiment, the air gap 322 would be absent.

It should be emphasized that the above-described embodiments are merely possible examples of implementations of the invention. Many variations and modifications may be made to the above-described embodiments. All such modifications and variations are intended to be included herein within the scope of this disclosure and protected by the following claims.

The invention claimed is:

1. A system comprising:
   a thermally conductive chassis having at least one panel with internal and external surfaces, and wherein the external surface is exposed to an environment having an environment temperature that is lower than an internal chassis temperature;
   a circuit board located within the chassis;
   at least one integrated circuit chip having a die, the chip positioned on the circuit board, the die operable to radiate an amount of thermal energy;
   an electronic component positioned on the circuit board within a vicinity of the chip; and
   a heat shield coupled to the chassis, the heat shield configured to protrude from the internal surface by an amount that sufficiently shields the electronic component from radiated thermal energy generated by the die.

2. The system of claim 1, wherein the heat shield includes a thermally reflective surface facing toward the chip.

3. The system of claim 1, wherein the heat shield is bonded to the chassis with a thermally insulative bonding material.

4. The system of claim 1, wherein a protruded length of the heat shield is configured to provide an air gap between a free end of the heat shield and the circuit board.

5. The system of claim 1, wherein the heat shield is integrally formed with a top panel of the chassis.

6. The system of claim 1, wherein the chassis is a three-part chassis having a top panel integrally formed with the heat shield, side panels coupled to the top panel, and a bottom panel coupled to the side panels.

7. The system of claim 1, wherein the heat shield comprises:
   a first portion that protrudes from the internal surface of the thermally conductive chassis; and
   a second portion that is adjacent to and that opposes the first portion,
   wherein the second portion of the heat shield shields the electronic component from the radiated thermal energy generated by the die.

8. The system of claim 7, wherein the first portion of the heat shield is integrally machined with a top panel of the thermally conductive chassis.

9. The system of claim 7, wherein the first portion of the heat shield faces the chip and includes a thermally absorptive surface.

10. The system of claim 7, wherein the first portion of the heat shield faces the chip and includes a radiant energy absorptive coating.

11. The system of claim 7, wherein the second portion of the heat shield faces away from the chip and is thermally insulative.

12. The system of claim 7, wherein the second portion of the heat shield faces away from the chip and includes a radiant energy insulative coating.

13. The system of claim 1, wherein the heat shield extends from a side panel of the thermally conductive chassis.

14. The system of claim 1, wherein the heat shield is integrally molded with a top panel of the thermally conductive chassis.

15. The system of claim 1, wherein the heat shield is integrally machined with a top panel of the thermally conductive chassis.

16. The system of claim 1, wherein the at least one panel of the thermally conductive chassis is a top panel, and wherein the heat shield is integrally machined with the top panel of the thermally conductive chassis.

17. A system comprising:
   a thermally conductive chassis having at least one panel with internal and external surfaces, and wherein the external surface is exposed to an environment having an environment temperature that is lower than an internal chassis temperature;
   a circuit board located within the chassis;
   a first electronic component positioned on the circuit board, the first electronic component operable to radiate an amount of thermal energy;
   a second electronic component positioned on the circuit board within a vicinity of the first electronic component; and
   a heat shield coupled to the chassis, the heat shield protruding from a panel of the chassis by an amount that substantially shields heat energy given off by the first electronic component from the second electronic component.

18. The system of claim 17, wherein the first electronic component is a microprocessor and the second electronic component is a computer memory device.

19. The system of claim 17, wherein the heat shield comprises:
   a first portion that protrudes from the internal surface of the at least one panel of the thermally conductive chassis; and
   a second portion that is adjacent to and that opposes the first portion,
   wherein the second portion of the heat shield shields the second electronic component from the heat energy given off by the first electronic component.

20. The system of claim 19, wherein the first portion of the heat shield faces the first electronic component and includes a radiant energy absorptive coating.

21. The system of claim 19, wherein the second portion of the heat shield faces away from the first electronic component and is thermally insulative.

22. The system of claim 19, wherein the second portion of the heat shield faces away from the first electronic component and includes a radiant energy insulative coating.

23. The system of claim 17, wherein the at least one panel of the thermally conductive chassis is a side panel, and wherein the heat shield extends from the side panel of the thermally conductive chassis.

24. The system of claim 17, wherein the at least one panel of the thermally conductive chassis is a top panel, and wherein the heat shield is integrally molded with the top panel of the thermally conductive chassis.

* * * * *